(12) United States Patent
Takahashi et al.

(10) Patent No.: US 10,351,949 B2
(45) Date of Patent: Jul. 16, 2019

(54) VAPOR PHASE GROWTH METHOD

(71) Applicant: NuFlare Technology, Inc., Kanagawa (JP)

(72) Inventors: Hideshi Takahashi, Yokohama (JP); Kiyotaka Miyano, Tokyo (JP); Masayuki Tsukui, Yokohama (JP); Hajime Nago, Yokohama (JP); Yasushi Iyechika, Matsudo (JP)

(73) Assignee: NuFlare Technology, Inc., Kanagawa (JP)

( * ) Notice: Subject to any disclaimer, the term of this patent is extended or adjusted under 35 U.S.C. 154(b) by 0 days.

(21) Appl. No.: 15/848,216

(22) Filed: Dec. 20, 2017

(65) Prior Publication Data
US 2018/0171471 A1  Jun. 21, 2018

(30) Foreign Application Priority Data

Dec. 21, 2016 (JP) ................ 2016-247843

(51) Int. Cl.
*C23C 16/32* (2006.01)
*H01L 21/02* (2006.01)
(Continued)

(52) U.S. Cl.
CPC ........ *C23C 16/325* (2013.01); *C23C 16/4584* (2013.01); *C23C 16/45504* (2013.01);
(Continued)

(58) Field of Classification Search
CPC .................................................. C23C 16/325
See application file for complete search history.

(56) References Cited

U.S. PATENT DOCUMENTS 5,406,906 A * 4/1995 Rimai ............... C30B 23/02
117/92
5,880,491 A * 3/1999 Soref ............... B82Y 20/00
257/18
(Continued)

FOREIGN PATENT DOCUMENTS

JP  2001-28334   1/2001
JP  2004-103671  4/2004
(Continued)

OTHER PUBLICATIONS

Taiwanese Office Action dated Jun. 5, 2018 issued in the corresponding Taiwanese patent application No. 106140772 and its English translation.
(Continued)

*Primary Examiner* — William Coleman
(74) *Attorney, Agent, or Firm* — Rankin, Hill & Clark LLP

(57) ABSTRACT

A vapor phase growth method according to an embodiment is a vapor phase growth method of forming on a single substrate a film having a composition different from a composition of the substrate. The method includes, rotating the single substrate with a center of the single substrate being a rotation center, heating a single substrate to a first temperature, and forming a silicon carbide film having a film thickness of 10 nm or more and 200 nm or less on a surface of the single substrate by supplying a first process gas containing silicon and carbon as a laminar flow in a direction substantially perpendicular to the surface of the single substrate.

22 Claims, 6 Drawing Sheets

(51) Int. Cl.
*C23C 16/455* (2006.01)
*C23C 16/458* (2006.01)
*C23C 16/46* (2006.01)
*G03F 1/62* (2012.01)

(52) U.S. Cl.
CPC ............. *C23C 16/46* (2013.01); *G03F 1/62* (2013.01); *H01L 21/02167* (2013.01); *H01L 21/02271* (2013.01); *C23C 16/45565* (2013.01); *H01L 21/02381* (2013.01); *H01L 21/02447* (2013.01); *H01L 21/02458* (2013.01)

(56) References Cited

U.S. PATENT DOCUMENTS

| | | | | |
|---|---|---|---|---|
| 6,045,626 | A * | 4/2000 | Yano | H01L 33/007 117/950 |
| 6,180,292 | B1 | 1/2001 | Acosta et al. | |
| 6,391,799 | B1 * | 5/2002 | Di Cioccio | H01L 21/0475 257/E21.06 |
| 6,592,664 | B1 * | 7/2003 | Frey | C30B 25/105 117/101 |
| 6,736,894 | B2 * | 5/2004 | Kawahara | C30B 25/02 117/101 |
| 8,080,826 | B1 * | 12/2011 | Johnson | H01L 21/2007 257/77 |
| 8,492,243 | B2 * | 7/2013 | Haeberlen | H01L 21/26506 438/455 |
| 8,778,736 | B2 * | 7/2014 | Purushothaman | H01L 21/56 438/118 |
| 9,011,598 | B2 * | 4/2015 | Boussagol | H01L 21/76254 117/1 |
| 9,412,823 | B2 * | 8/2016 | Ota | H01L 29/1608 |
| 9,478,938 | B2 * | 10/2016 | Williams | C23C 16/274 |
| 9,624,602 | B2 * | 4/2017 | Kageshima | C30B 29/36 |
| 2003/0056718 | A1 * | 3/2003 | Kawahara | C30B 25/18 117/84 |
| 2009/0065812 | A1 | 3/2009 | Abe et al. | |
| 2011/0089433 | A1 | 4/2011 | Kawamura et al. | |
| 2012/0244684 | A1 * | 9/2012 | Suzuki | C23C 16/45517 438/478 |
| 2013/0040103 | A1 | 2/2013 | Asamura | |
| 2014/0283736 | A1 * | 9/2014 | Nishio | C23C 16/22 117/93 |
| 2015/0222087 | A1 * | 8/2015 | Williams | C23C 16/274 428/64.1 |
| 2016/0024652 | A1 | 1/2016 | Ito | |
| 2017/0130335 | A1 | 5/2017 | Yamada et al. | |
| 2018/0057938 | A1 | 3/2018 | Takahashi et al. | |

FOREIGN PATENT DOCUMENTS

| | | |
|---|---|---|
| JP | 2009-302097 | 12/2009 |
| JP | 2017-92140 | 5/2017 |
| JP | 2018-37456 | 3/2018 |
| TW | 200921909 | 5/2009 |
| TW | 201202490 A | 1/2012 |
| TW | 201614101 A | 4/2016 |

OTHER PUBLICATIONS

Habuka, Hitoshi, "Low Temperature Deposition of Polycrystalline Silicon Carbide Film Using Monomethylsilane Gas," Properties and Application of Silicon Carbide, Apr. 2011, chapter 3 pp. 55-77, http://cdn.intechopen.com/pdfs/15085.pdf.

Korean Office Action dated Jan. 30, 2019 issued in the corresponding Korean patent application No. 10-2017-0165025 and its English machine translation.

Taiwanese Office Action dated Jan. 9, 2019 issued in the corresponding Taiwanese patent application No. 106140772 and its English machine translation.

* cited by examiner

VAPOR PHASE GROWTH METHOD

CROSS-REFERENCE TO RELATED APPLICATION

This application is based upon and claims the benefit of priority from Japanese Patent Applications No. 2016-247843, filed on Dec. 21, 2016, the entire contents of which are incorporated herein by reference.

FIELD OF THE INVENTION

Embodiments described herein relate generally to a vapor phase growth method for forming a silicon carbide thin film on a large area substrate.

BACKGROUND OF THE INVENTION

Silicon carbide (hereinafter also referred to as SiC) is characterized by a low lattice constant difference with gallium nitride (hereinafter also referred to as GaN) based semiconductors, high heat resistance, high hardness, and being a wide bandgap semiconductor, or the like. Thus, thin film of silicon carbide has high industrial utility value. For example, there has been an increased interest in utilizing the silicon carbide as a high-strength protective film capable of withstanding high temperatures, a buffer layer for a substrate at the time of growth of a GaN-based semiconductor, and a window material for optical equipment utilizing high light transmittance.

In industrial application of the silicon carbide film, it is desired to form a thin film having a large area having few defects and high film thickness uniformity. JP 2004-103671 describes a method for forming a high quality silicon carbide film on a silicon substrate.

SUMMARY OF THE INVENTION

A vapor phase growth method according to one aspect of the present disclosure is vapor phase growth method of forming on or above a single substrate a film having a composition different from a composition of the substrate, the method comprising: rotating the single substrate with a center of the single substrate being a rotation center; heating the single substrate to a first temperature; and forming a silicon carbide film having a film thickness of 10 nm or more and 200 nm or less on a surface of the single substrate by supplying a first process gas containing silicon and carbon as a laminar flow in a direction substantially perpendicular to the surface of the single substrate.

A vapor phase growth method comprising:
loading a substrate into a reaction chamber of a single wafer type vapor phase growth apparatus; holding the substrate on a holder provided in the reaction chamber; rotating the substrate with a center of the substrate being a rotation center; heating the substrate to a first temperature; and forming a silicon carbide film having a film thickness of 10 nm or more and 200 nm or less on or above a surface of the substrate by supplying a first process gas containing silicon and carbon from a shower plate, the shower plate provided substantially parallel to the surface of the substrate and facing the surface of the substrate, and the shower plate provided on an upper portion of the reaction chamber.

DETAILED DESCRIPTION OF THE EMBODIMENTS

Figure 1:
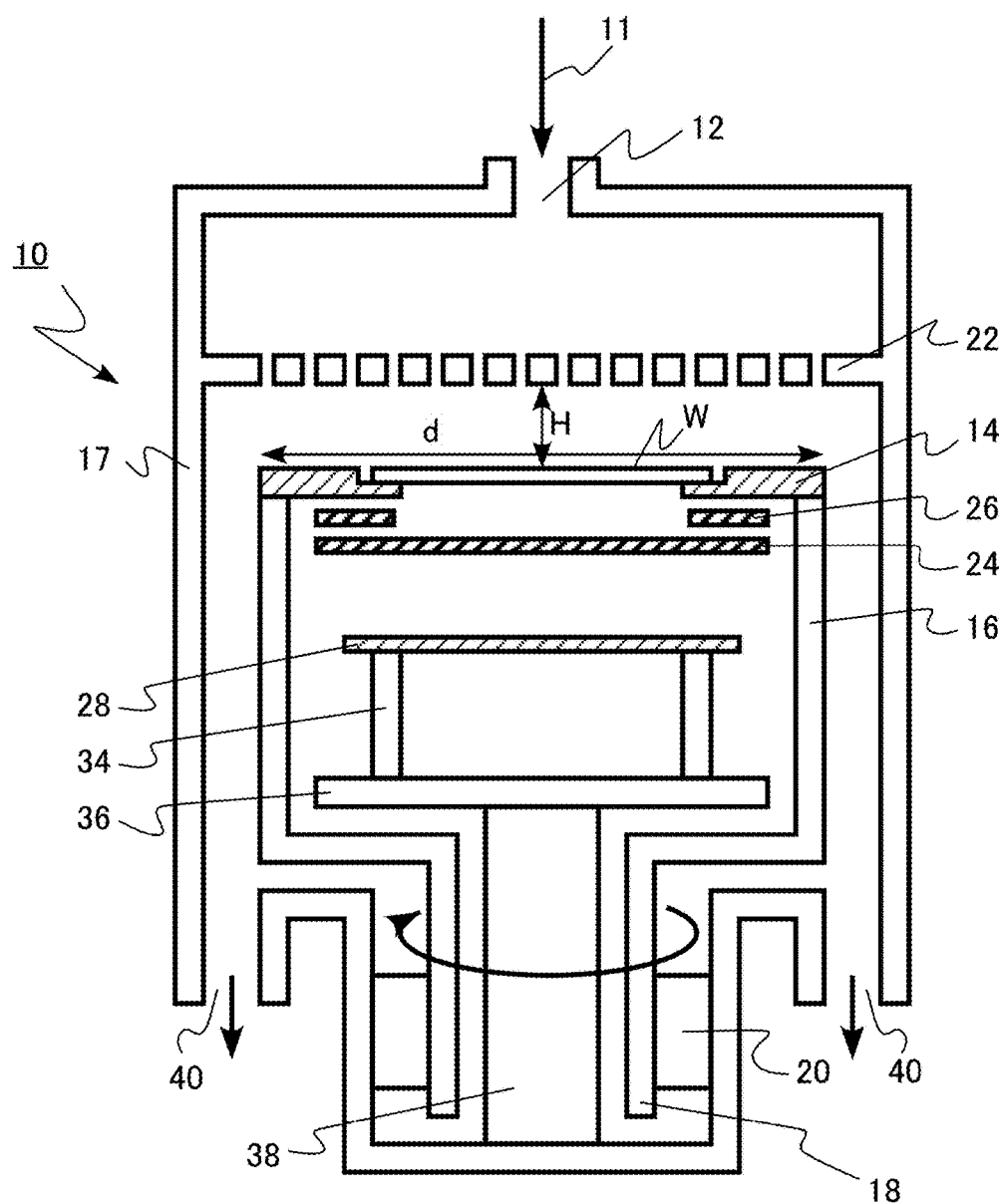
FIG. 1 is a schematic cross-sectional view of a vapor phase growth apparatus according to an embodiment.

Hereinafter, embodiments of the present disclosure will be described with reference to the drawings.

In this specification, same reference numerals are given to same or similar members in some cases.

In the present specification, a gravity direction in a state where a vapor phase growth apparatus is film formably installed is defined as "lower", and the opposite direction of the lower direction is defined as "upper". Accordingly, a "lower portion" means a position in the gravity direction with respect to a reference, and "downward" or "below" means a gravity direction with respect to the reference. In contrast, "upper portion" means a position opposite to the gravity direction with respect to the reference, and "upward" or "above" means a direction opposite to the gravity direction with respect to the reference. In addition, a "vertical direction" corresponds to the gravity.

In this specification, a "process gas" is a generic name of a gas used for forming a film on a substrate, and is a concept including a source gas, a carrier gas, a dilution gas.

A vapor phase growth method according to an embodiment is a vapor phase growth method of forming on or above a single substrate a film having a composition different from a composition of the substrate. The method includes: rotating the single substrate with a center of the substrate being a rotation center; heating the single substrate to a first temperature; and forming a silicon carbide film having a film thickness of 10 nm or more and 200 nm or less on a surface of the single substrate by supplying a first process gas containing silicon and carbon as a laminar flow in a direction substantially perpendicular to the surface of the single substrate.

A vapor phase growth method according to an embodiment includes: loading a substrate into a reaction chamber of a single wafer type vapor phase growth apparatus; holding the substrate on a holder provided in the reaction chamber; rotating the substrate; heating the substrate to a first temperature; and forming a silicon carbide film having a film thickness of 10 nm or more and 200 nm or less on or above a surface of the substrate by supplying a first process gas containing silicon and carbon from a shower plate, the shower plate provided substantially parallel to the surface of the substrate and facing the surface of the substrate, and the shower plate provided on an upper portion of the reaction chamber.

Furthermore, a vapor phase growth method according to an embodiment includes: heating the single substrate to a second temperature before heating the single substrate to the first temperature; and performing surface treatment by supplying a second process gas containing silicon and carbon as a laminar flow in a direction substantially perpendicular to the surface of the single substrate.

FIG. 1 is a schematic cross-sectional view of a vapor phase growth apparatus used in the vapor phase growth method according to the embodiment. The vapor phase growth apparatus according to the embodiment is a single wafer type vapor phase growth apparatus.

The vapor phase growth apparatus according to the embodiment includes a reaction chamber 10. The reaction chamber 10 includes a gas supply port 12, an annular holder 14, a rotating body unit 16, a rotary shaft 18, a rotation drive mechanism 20, a shower plate 22, an inner heater 24, an outer heater 26, a reflector 28, a support column 34, a fixing base 36, a fixing shaft 38, and a gas discharge port 40.

The reaction chamber 10 includes a stainless steel cylindrical wall surface 17, for example. The gas supply port 12 is provided at the top of the reaction chamber 10.

The gas supply port 12 supplies a process gas 11 to the reaction chamber 10. For example, the process gas 11 containing a source gas of silicon carbide (SiC) is supplied from the gas supply port 12.

The process gas 11 is a gas containing silicon (Si) and carbon (C), for example. The gas containing silicon (Si) and carbon (C) is a source gas of SiC. The process gas 11 contains chlorine (Cl), for example.

The process gas 11 is a mixed gas of an organosilicon gas and hydrogen chloride (HCl), for example. In this case, the organosilicon gas serves as a source gas for SiC. The organosilicon gas is monomethylsilane ($CH_3SiH_3$), for example.

As the process gas 11, for example, a mixed gas of a silane-based gas and a hydrocarbon-based gas may be used for a source gas of SiC. Examples of the silane-based gas include silane ($SiH_4$) and disilane ($Si_2H_6$). The hydrocarbon-based gas is propane ($C_3H_8$), for example.

As the process gas 11, for example, a mixed gas of a silane-based gas containing chlorine and a hydrocarbon-based gas can also be used. Examples of the silane-based gas containing chlorine include trichlorosilane ($SiHCl_3$), dichlorosilane ($SiH_2Cl_2$), trichloromethylsilane ($CH_3SiCl_3$), and silicon tetrachloride ($SiCl_4$).

The process gas 11 may contain a carrier gas. Examples of the carrier gas include hydrogen ($H_2$), helium (He), and argon (Ar). Note that chlorine is not necessarily contained in the process gas 11.

The shower plate 22 is provided at an upper portion of the reaction chamber 10. The shower plate 22 is provided with a plurality of gas ejection holes. The process gas 11 supplied from the gas supply port 12 is ejected into the reaction chamber 10 from the gas ejection holes. It is allowable to provide a coolant passage inside the shower plate to maintain the temperature at a constant level by the coolant.

The annular holder 14 is provided inside the reaction chamber 10. The annular holder 14 is an example of a holder. On the annular holder 14, a wafer W as an example of the substrate can be held. The annular holder 14 is provided with an opening at a center portion. The outer diameter (d in FIG. 1) of the annular holder 14 is 40 cm or less, for example.

The shower plate 22 is provided in substantially parallel to and facing the surface of the wafer W held on the annular holder 14. The distance (H in FIG. 1) between the surface of the wafer W and the shower plate 22 is 3 cm or more and 20 cm or less, for example.

The annular holder 14 is formed with ceramics such as silicon carbide (SiC), tantalum carbide (TaC), boron nitride (BN), pyrolytic graphite (PG), or carbon, as a base material. Carbon coated with SiC, BN, TaC, PG, or the like can be used as the annular holder 14, for example.

The annular holder 14 is fixed to the upper portion of the rotating body unit 16. The annular holder 14 is supported by an outer peripheral portion by the rotating body unit 16. The rotating body unit 16 is fixed to the rotary shaft 18. The annular holder 14 is indirectly fixed to the rotary shaft 18.

The rotary shaft 18 is rotatable by the rotation drive mechanism 20. By rotating the rotary shaft 18 with the rotation drive mechanism 20, it is possible to rotate the annular holder 14. By rotating the annular holder 14, it is possible to rotate the wafer W held on the annular holder 14.

For example, the wafer W is rotated at a rotation speed of 50 rpm or more and 3000 rpm or less. The rotation drive mechanism 20 is configured with a motor and a bearing, for example.

The inner heater 24 and the outer heater 26 are provided below the annular holder 14. The inner heater 24 and the outer heater 26 are provided within the rotating body unit 16. The outer heater 26 is provided between the inner heater 24 and the annular holder 14.

The inner heater 24 and the outer heater 26 heat the wafer W held by the annular holder 14. The inner heater 24 heats at least the center portion of the wafer W. The outer heater 26 heats an outer peripheral region of the silicon wafer W. The inner heater 24 has a disk shape, for example. The outer heater 26 is annular, for example.

The inner heater 24 and the outer heater 26 illustrated in FIG. 1 can heat the wafer W by being heated by energization from outside (not illustrated). Examples of materials applicable for the inner heater 24 and the outer heater 26 include high melting point metals such as tungsten, rhenium, and molybdenum, and conductive ceramics such as graphite and SiC. In the case of using these ceramic materials, the surface of the heater may be appropriately coated with a material such as BN, SiC, pyrolytic graphite, and SiC.

The reflector 28 is provided below the inner heater 24 and the outer heater 26. The inner heater 24 and the outer heater 26 are provided between the reflector 28 and the annular holder 14.

The reflector 28 reflects the heat radiated downward from the inner heater 24 and the outer heater 26, thereby increasing the heating efficiency of the wafer W. The reflector 28 also prevents members below the reflector 28 from being heated. The reflector 28 has a disk shape, for example.

The reflector 28 is formed of a material having high heat resistance. The reflector 28 has heat resistance to a temperature of 1100° C. or more, for example The reflector 28 is formed with ceramics such as SiC, TaC, carbon, BN, and PG, or a metal such as tungsten, as a base material. When ceramics is used for the reflector 28, a sintered body or a base material produced by vapor phase growth can be used. The reflector 28 may also be formed by coating a carbon base material, or the like, with ceramics such as SiC, TaC, BN, PG, and glassy carbon.

The reflector 28 is fixed to the fixing base 36 by a plurality of support columns 34, for example. The fixing base 36 is supported by the fixing shaft 38, for example.

While the example of FIG. 1 is a case where the wafer W is heated by the action of a heater, induction heating, lamp heating, or the like can also be used as a means for heating the wafer W. In that case, the configuration may be modified appropriately from the configuration illustrated in FIG. 1.

The rotating body unit 16 is provided with a push up pin (not illustrated) in order to detach the wafer W from the annular holder 14. The push up pin penetrates the reflector 28 and the inner heater 24, for example.

The gas discharge port 40 is provided at the bottom of the reaction chamber 10. The gas discharge port 40 discharges the excess process gas 11 remaining after the reaction of the process gas 11 on the surface of the wafer W, to the outside of the reaction chamber 10.

Moreover, a wafer port and a gate valve (not illustrated) are provided on the wall surface 17 of the reaction chamber 10. It is possible to load/unload the wafers W into/from the reaction chamber 10 through the wafer port and the gate valve.

Next, a vapor phase growth method according to the embodiment will be described. The vapor phase growth method according to the embodiment uses an epitaxial growth apparatus illustrated in FIG. 1. FIGS. 2A, 2B, 2C, and 2D are explanatory diagrams of the vapor phase growth method according to the embodiment.

In the method, a film having a composition different from a composition of the substrate is formed. The substrate includes a material different from silicon carbide (SiC). For the substrate on which silicon carbide (SiC) is formed, it is possible to use the substrate produced with a material of high purity and excellent in flatness in a relatively large area and discharging no impurities in the film forming process. Specifically, it is possible to use a semiconductor material such as silicon, a ceramic material such as graphite, quartz, sapphire, and mica, or a high melting point metal material such as tungsten. Moreover, a coating layer made of material different from that of the substrate may be formed on the substrate. As the material used for the coating layer, the above-mentioned semiconductor material, ceramic material, metal material, or the like can be used.

Specifically, it is possible to use a semiconductor material such as silicon or germanium, an oxide material such as silicon oxide or aluminum oxide, a carbon material such as graphite, graphene, and pyrolytic graphite, a nitride material such as boron nitride, aluminum nitride, silicon nitride, and a metal material such as tungsten, molybdenum, and gold for the coating layer. The coating layer may be one layer or a stacked film of two or more layers. An example in which a film of two or more layers is stacked is an SOI substrate in which a silicon oxide layer and a surface silicon layer are formed on a silicon substrate.

In particular, layered compounds such as graphite and graphene have weak chemical bonds with layers to be stacked on graphite or graphene, and there are cases where stress is less likely to be applied to the SiC film during the formation of the SiC film on a layered compound, and thus, are suitable as substrates or coating layer.

By forming the coating layer on the surface in the reaction chamber illustrated in FIG. 1 on the substrate, it is possible to perform SiC film forming process without removing the substrate from the reaction chamber. It is also possible to use a wafer W with the coating layer.

Moreover, in a case where silicon is used as a substrate, an SiC thin film can be formed by carbonizing the surface with a hydrocarbon gas such as propane at high temperature, and the SiC thin film can be used as a coating layer. Such an SiC thin film functions as a buffer layer with SiC that grows afterward and can be suitably used because of its possibility of enhancing flatness and film quality.

When the temperature is lowered after film formation of the SiC, the substrate may generate stress in the SiC due to a difference in thermal expansion coefficient between the substrate and SiC. In order to suppress the generation of such stress, there are cases where a substrate with low rigidity can be suitably used. Alternatively, it is possible to use a known substrate after decreasing the rigidity of the entire substrate by causing a damage inside or surface of the substrate by irradiating a laser beam or an electron beam in advance toward the substrate. Still alternatively, it is also allowable to use a substrate previously deformed into a protruding shape or scraped into a protruding shape.

The substrate can be formed of a material of single crystal, polycrystalline or amorphous.

Hereinafter, an exemplary case where an SiC thin film is formed on a single crystal silicon wafer W as an exemplary wafer W will be described. An exemplary case in which film formation is performed in two stages of surface treatment of the substrate and film formation of SiC will be described.

Figure 2A:
FIGS. 2A, 2B, 2C and 2D are explanatory diagrams of a vapor phase growth method according to the embodiment.

First, a silicon wafer W is prepared (FIG. 2A). The silicon wafer W is an example of the wafer W. For example, the silicon wafer W is a single crystal silicon having a {111} plane or a {001} plane as a surface. The error of the plane orientation of the silicon wafer W is preferably 3 degrees or less, more preferably 2 degrees or less. Note that the notation of the {111} plane and the {001} plane indicates planes crystallographically equivalent to a (111) plane and a (001) plane, respectively. The thickness of the silicon wafer W is 700 μm or more and 1.2 mm or less, for example. The diameter of the silicon wafer W is 200 mm or more and 300 mm or less.

Next, one silicon wafer (single silicon wafer) W is loaded into the reaction chamber 10. Next, the silicon wafer W is held on a substrate holding surface of the annular holder 14. At this time, the surface of the silicon wafer W and the shower plate 22 are spaced apart from each other by 3 cm or more.

Next, the silicon wafer W is heated by the inner heater 24 and the outer heater 26 provided below the annular holder 14 while being rotated by the rotation drive mechanism 20. The silicon wafer W rotates about a normal passing through substantially the center of the silicon wafer W.

The rotation speed of the silicon wafer W is 500 rpm or more and 2000 rpm or less, for example. The silicon wafer W is heated to a temperature of 1000° C. or more and 1200° C. or less, for example.

Next, pretreatment is performed by supplying a gas containing hydrogen to the surface of the silicon wafer W. By supplying the gas containing hydrogen to the surface of the silicon wafer W, an oxide film on the surface of the silicon wafer W is removed.

Next, the silicon wafer W is heated to a surface treatment temperature (second temperature) by the inner heater 24 and the outer heater 26 while being rotated by the rotation drive mechanism 20.

The rotation speed of the silicon wafer W is 500 rpm or more and 2000 rpm or less, for example. The surface treatment temperature is 600° C. or more and 1000° C. or less, for example.

Figure 2B:
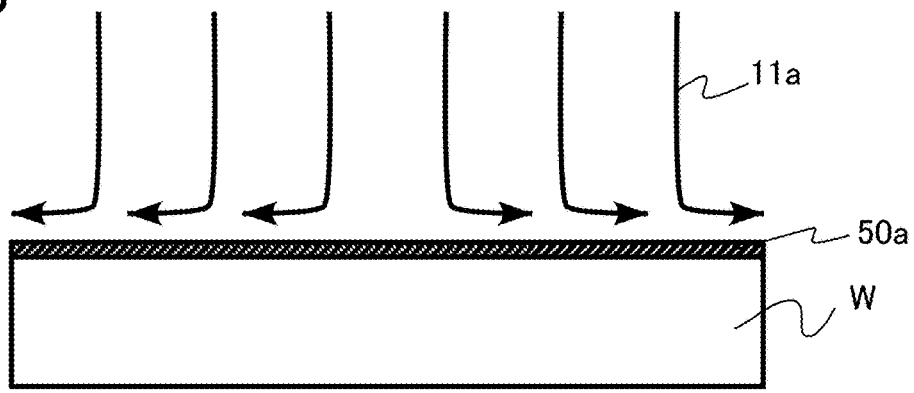

Next, a surface treatment gas (second process gas) 11a containing silicon and carbon is supplied to the surface of the silicon wafer W to treat the surface of the silicon wafer W, thereby forming a coating layer 50a (FIG. 2B). The surface treatment is carbonization treatment, for example.

The coating layer 50a is SiC formed by formation of chemical bonds between silicon on the surface of the silicon wafer W and the carbon in the surface treatment gas 11a, for example. The surface treatment gas 11a is monomethylsilane, for example. The film thickness of the coating layer 50a is 0.1 nm or more and 10 nm or less, for example.

It is also possible to include chlorine in the surface treatment gas 11a. For example, the surface treatment gas 11a may be a mixed gas of monomethylsilane and hydrogen chloride.

The surface treatment gas 11a is supplied as a laminar flow in a direction substantially perpendicular to the surface of the silicon wafer W. The surface treatment gas 11a supplied as a laminar flow to the surface of the silicon wafer W flows toward the outer periphery of the rotating silicon wafer W, so as to form a thin concentration boundary layer on the surface of the silicon wafer W.

The pressure inside the reaction chamber 10 at the time of treatment of the surface of the silicon wafer W is 1 kPa or more and 100 kPa or less, for example. In other words, the pressure of the atmosphere at the time of treatment of the surface of the silicon wafer W is 1 kPa or more and 100 kPa or less, for example.

Next, the silicon wafer W is heated to a film formation temperature (first temperature) by the inner heater 24 and the outer heater 26 while being rotated by the rotation drive mechanism 20.

The rotation speed of the silicon wafer W is 500 rpm or more and 2000 rpm or less, for example. The film formation temperature is 800° C. or more and 1200° C. or less, for example.

Figure 2C:
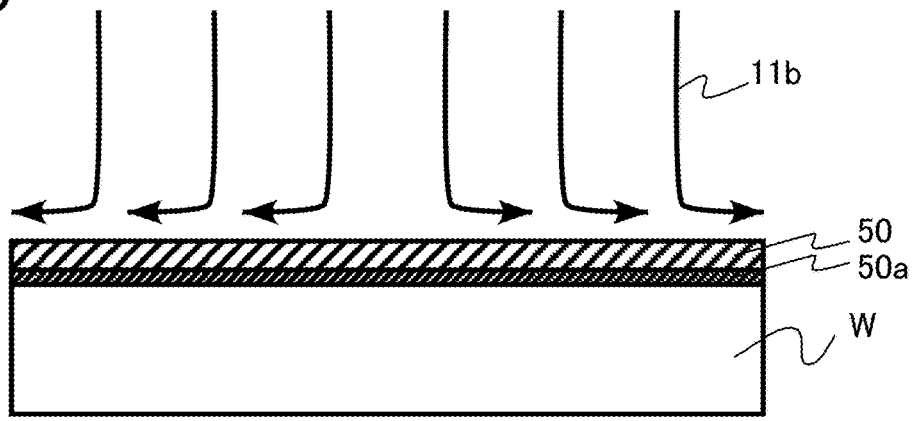

Next, a film formation gas (first process gas) 11b containing silicon, carbon, and chlorine is supplied to the surface of the silicon wafer W, thereby forming an SiC film 50 on the surface of the silicon wafer W (FIG. 2C). The SiC film 50 is formed on the coating layer 50a. The film formation gas 11b is a mixed gas of monomethylsilane and hydrogen chloride, for example.

The film formation gas 11b is supplied as a laminar flow in a direction substantially perpendicular to the surface of the silicon wafer W. The film formation gas 11b supplied as a laminar flow to the surface of the silicon wafer W flows toward the outer periphery of the rotating silicon wafer W and forms a thin concentration boundary layer on the surface of the silicon wafer W.

The pressure within the reaction chamber 10 at the time of formation of the SiC film 50 on the coating layer 50a is 1 kPa or more and 100 kPa or less, for example. In other words, the pressure of the atmosphere at the time of formation of the SiC film 50 on the coating layer 50a is 1 kPa or more and 100 kPa or less, for example.

The SiC film 50 is 3C-SiC, for example. The SiC film 50 is an amorphous film or a polycrystalline film, for example. The film thickness of the SiC film 50 is 10 nm or more and 200 nm or less, for example.

Figure 2D:

After formation of the SiC film 50, heating by the inner heater 24 and the outer heater 26 is stopped so as to lower the temperature of the silicon wafer W. After the temperature of the silicon wafer W is lowered to a predetermined temperature or less, the rotation of the silicon wafer W is stopped. After that, the silicon wafer W is unloaded from the reaction chamber 10 with the surface of the SiC film 50 is exposed (FIG. 2D).

For example, after the silicon wafer W is unloaded from the reaction chamber 10 with the surface of the SiC film 50 exposed, a GaN-based semiconductor is grown on the SiC film 50 in another reaction chamber. Moreover, for example, after the silicon wafer W is unloaded from the reaction chamber 10 with the surface of the SiC film 50 exposed, the silicon wafer W is exposed to the atmosphere. Alternatively, a protective film or a GaN-based semiconductor may be formed on the SiC film 50 itself and then the silicon wafer W may be unloaded from the reaction chamber 10.

While the above example is a case where the surface treatment of the substrate and the film formation of the SiC film 50 are performed consecutively, the surface treatment may be omitted and solely the SiC film 50 may be formed. Alternatively, surface treatment and film formation of the SiC film 50 may be performed in three or more steps in combination.

Next, a function and an effect of the vapor phase growth method according to the present embodiment will be described.

Since the lattice constant of the SiC film is close to the lattice constant of a GaN-based semiconductor, an SiC film formed on the substrate can be used as a buffer layer between the substrate and the GaN-based semiconductor. The stress generated between the SiC film and the substrate would cause cracking, breaking, and warping of the substrate, and thus, the SiC film to be formed needs to be a sufficiently thin film. On the other hand, in order to achieve no defects over a large area in the semiconductor layer grown on the SiC buffer layer, the SiC film needs to have no pinholes, or the like.

The SiC film used as a window member of an optical equipment needs to minimize attenuation of light. Therefore, the film thickness needs to be extremely thin, about 50 nm, for example. In addition, in order to suppress variation in light transmittance, there is a need to achieve high film thickness uniformity and high film quality uniformity. Moreover, in order to cover a large diameter window, there is a need to achieve film formation in a large area of about 200 mm in diameter, for example. In addition, there is a need to suppress the density of defects such as pinholes to a low level.

Figure 3:
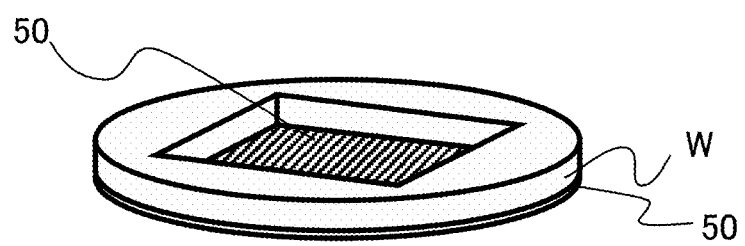
FIG. 3 is a diagram illustrating an example of a pellicle using an SiC film formed by the vapor phase growth method according to the embodiment.

Examples of application of the window material of the optical equipment of the SiC film formed by the vapor phase growth method of the present embodiment include a window material for a photodiode and a solar cell, a pellicle member for a photomask. FIG. 3 is a diagram illustrating an example of a pellicle as an application example using an SiC film formed by the vapor phase growth method according to the embodiment. Since SiC is a wide bandgap semiconductor, the light transmittance in the short wavelength region is high, and the pellicle illustrated in FIG. 3 can be used in the short wavelength region.

The SiC film 50 produced in the present embodiment has a thickness of about 50 nm and an area of about 50 mm×50 mm. In other words, the ratio of the length in the transverse direction to the thickness is about $10^6$. This ratio corresponds to a film with a thickness of 1 mm and a width of 1 km square.

Meanwhile, the following is needed for a film forming apparatus for forming a uniform SiC thin film on such a large area substrate. That is, the film forming apparatus needs to: (1) have a structure in which generation and adherence of particles are sufficiently suppressed inside the film forming apparatus in order to prevent occurrence of pinholes and defects; (2) enable formation of a film with a uniform film thickness on a large area substrate in order to avoid generation of cracks and breaking in the SiC thin film after completion of the production of final members, or in order to achieve optical homogeneity; and (3) have high uniformity of film forming environment within the substrate during film formation, high temperature uniformity in particular, for achieving uniformity of the film quality of the SiC thin film.

The vapor phase growth method according to the embodiment uses a single wafer type vapor phase growth apparatus, making it possible to form a large area SiC thin film with high film thickness uniformity and high film quality uniformity and low density of defects. Details will be described below.

Figure 4A:
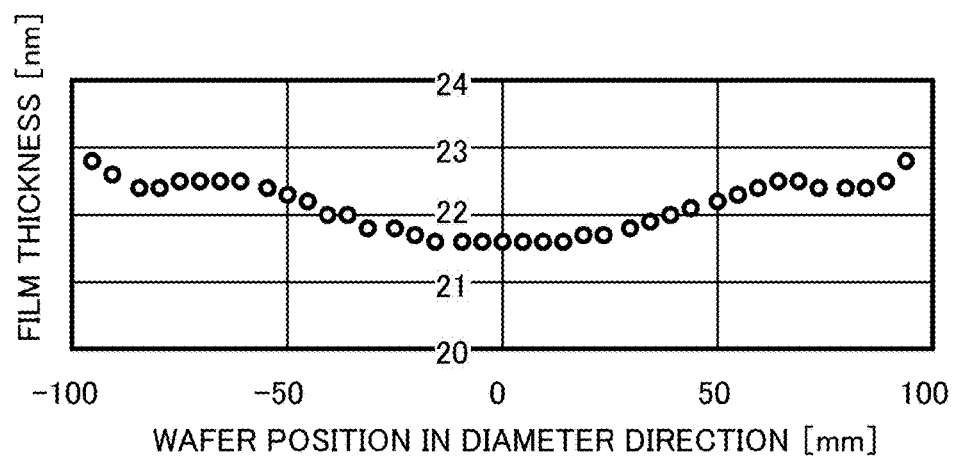
FIGS. 4A and 4B are diagrams illustrating evaluation results of the SiC film formed by the vapor phase growth method according to the embodiment.
Figure 4B:
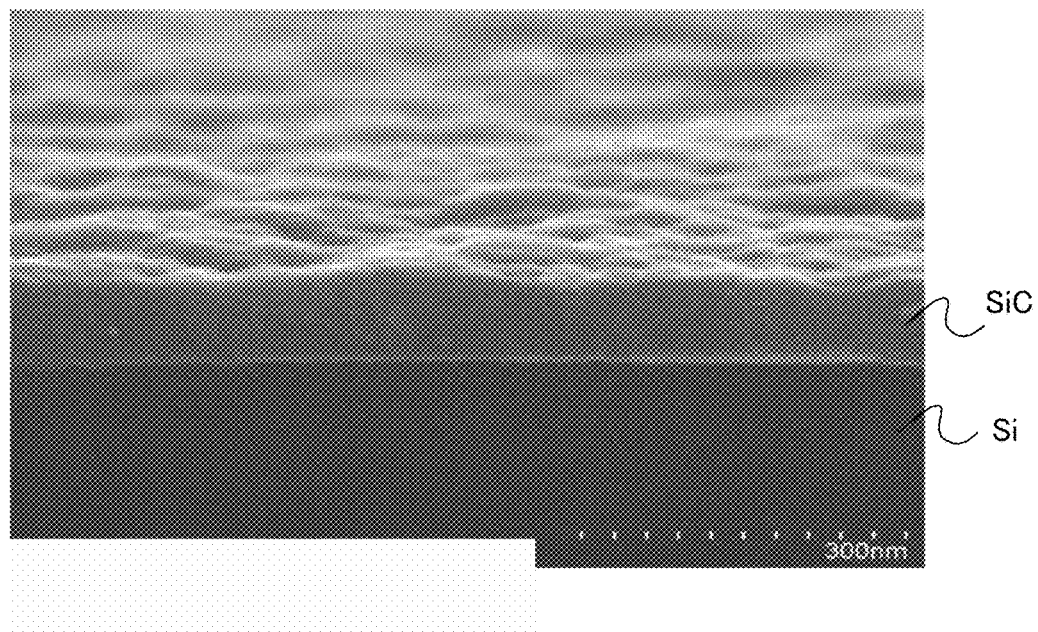

FIGS. 4A and 4B are diagrams illustrating evaluation results of the SiC film 50 formed by the vapor phase growth method according to the embodiment. Both the SiC films illustrated in FIGS. 4A and 4B are SiC film formed without performing surface treatment for the silicon wafer W.

FIG. 4A is a diagram illustrating film thickness uniformity of the SiC film 50 formed by the vapor phase growth method according to the embodiment. FIG. 4A illustrates a measurement result of a film thickness along the diameter direction of a wafer of 200 mm in diameter. Measurement is done with an ellipsometer.

As illustrated in FIG. 4A, it is possible to achieve extremely high film thickness uniformity with an average film thickness within the wafer plane of 22.1 nm and a standard deviation of 0.37 nm.

FIG. 4B is a scanning electron microscope (SEM) photograph of the SiC film 50 formed by the vapor phase growth method according to the embodiment. The film thickness of the SiC layer is about 100 nm. As illustrated in FIG. 4B, it is possible to confirm formation of the uniform SiC film 50 having high film quality uniformity without defects such as pinholes.

The vapor phase growth method according to the embodiment uses a single wafer type vapor phase growth apparatus illustrated in FIG. 1. A silicon wafer W as an example of the substrate is held on the annular holder 14 provided with an opening at the center portion. The annular holder 14 is supported by an outer peripheral portion by the rotating body unit 16.

An opening is provided at the center of the annular holder 14, and there is no member in proximity to the back surface of the silicon wafer W. Therefore, even when deformation such as warping of the silicon wafer W occurs, the deformation would not have much influence on the temperature distribution of the silicon wafer W. This leads to high temperature uniformity within the silicon wafer W plane.

Moreover, the annular holder 14 is supported by the outer peripheral portion. In other words, there is no center shaft supporting the annular holder 14 at its center. Existence of the center shaft might generate heat conduction through the center shaft, leading to a possibility of lower uniformity of the temperature of the surface of the silicon wafer W. In this respect, the vapor phase growth method according to the embodiment achieves high temperature uniformity within the wafer surface.

With the vapor phase growth method according to the embodiment, high film thickness uniformity and high film quality uniformity of the SiC film 50 can be achieved due to high uniformity of the temperature within the plane of the silicon wafer W.

The vapor phase growth method according to the embodiment uses a single wafer type vapor phase growth apparatus. In this, the process gas 11 is supplied as a laminar flow in a direction substantially perpendicular to the surface of the silicon wafer W. The process gas 11 supplied as a laminar flow to the surface of the silicon wafer W flows toward the outer periphery of the rotating silicon wafer W as illustrated in FIGS. 2B and 2C. Therefore, suppression of the effect of adversely affecting the film formation, namely, an edge effect can be realized. The edge effect occurs when the process gas 11 passes over the edge of the wafer W along parallel direction to the surface of the wafer W. In such a case, the process gas 11 becomes a turbulent flow after passing over the edge of the wafer W. In a single wafer type vapor phase growth apparatus such as used in the embodiment, the process gas 11 flows from the wafer W to the outside of the wafer W as shown in FIGS. 2B and 2C, which avoids occurring the edge effect on the wafer W. The suppression of the edge effect on the wafer W enhances high film thickness uniformity and high film quality uniformity of the SiC film 50 formed on the surface of the silicon wafer W.

In the vapor phase growth method according to the embodiment, the process gas 11 is supplied from the shower plate 22 provided in substantially parallel to and facing the surface of the silicon wafer W. That is, the process gas 11 flows in a vertical direction in the reaction chamber 10. This makes it possible to suppress adhesion of the reaction products to the surface of the shower plate 22 facing the surface of the silicon wafer W.

Furthermore, the surface of the silicon wafer W and the shower plate 22 are spaced apart from each other by 3 cm or more. Due to a wide space between the surface of the silicon wafer W and the shower plate 22, it is possible to suppress a state where the process gas 11 that has reached the surface of the silicon wafer W returns to the shower plate 22 and the reaction product adheres to the surface of the shower plate 22. In other words, due to the wide space between the surface of the silicon wafer W and the shower plate 22, turbulence is unlikely to occur between the surface of the silicon wafer W and the shower plate 22, leading to suppression of adhesion of reaction products to the surface of the shower plate 22.

Since adhesion of the reaction products to the surface of the shower plate 22 facing the surface of the silicon wafer W is unlikely to occur, it is possible to suppress on the SiC film 50 generation of defects due to falling of the reaction product adhering to the shower plate 22 onto the surface of the silicon wafer W. This leads to formation of the SiC film 50 having a low density of defects.

In the case of the cold wall type in which the wall surface 17 surrounding the interior of the reaction chamber 10 is cooled like the single wafer type apparatus according to the embodiment, the distance between the surface of the silicon wafer W and the shower plate 22 is preferably 3 cm or more and 20 cm or less, and more preferably 5 cm or more and 15 cm or less. In a case where the distance is below the above-described range, the process gas 11 that has reached the surface of the silicon wafer W might return to the shower plate 22 side again, and reaction products might adhere to the surface of the shower plate 22. On the other hand, in a case where the distance exceeds the above-described range, thermal convection might occur inside the reaction chamber 10, and the film thickness uniformity and film quality uniformity of the SiC film 50 formed on the surface of the silicon wafer W might be degraded.

In the case of the hot wall type in which the wall surface 17 surrounding the interior of the reaction chamber 10 is heated, the distance between the surface of the silicon wafer W and the shower plate 22 is preferably 5 cm or more and 60 cm or less, and more preferably 10 cm or more and 50 cm or less.

The outer diameter of the annular holder 14 is preferably 40 cm or less, and more preferably 35 cm or less. In a case where the outer diameter exceeds the above-described range, turbulent flow accompanying the rotation of the annular holder 14 might occur. Generation of turbulent flow inside the reaction chamber 10 might lead to adhesion of reaction products to undesirable positions inside the reaction chamber 10, and might lead to generation of defects in the SiC film 50, or degradation of the film thickness uniformity and film quality uniformity of the SiC film 50.

The SiC film 50 formed on the surface of the silicon wafer W is preferably has crystal structure of 3C-SiC. Since 3C-SiC can be formed at a relatively low temperature among SiC polymorphs, and thus can be easily formed on a silicon wafer W having a lower melting point than SiC.

Alternatively, the SiC film 50 formed on the surface of the silicon wafer W is preferably an amorphous film or a polycrystalline film. Amorphous films and polycrystalline films have smaller optical or mechanical anisotropy than single crystal films. Therefore, it is suitable for application to optical members that transmit light. Amorphous films or polycrystalline films are preferable because of their possibilities of achieving flexibility and achieving damage-resistant property at the time of being processed into a final product, as compared with single crystal films.

The film thickness of the SiC film 50 formed on the surface of the silicon wafer W is preferably 10 nm or more and 200 nm or less, and more preferably 30 nm or more and 80 nm or less. In a case where the thickness is below the above-described range, the strength of the SiC film might be insufficient. In addition, in a case where the film thickness exceeds the above-described range, cracks, breaking, warping, or the like, might be generated in the substrate after the film formation, or attenuation of the transmitted light might become too large in a case of being used as a window material of optical equipment.

In treatment of the surface of the silicon wafer W and formation of the SiC film 50 on the surface of the silicon wafer W, the rotation speed of the silicon wafer W is preferably 500 rpm or more and 2000 rpm or less, more preferably 800 rpm or more and 1800 rpm or less. In a case where the rotation speed is below the above-described range, there might be cases where convection is generated in the gas flow from the shower plate, where no laminar flow occurs, or where utilization efficiency of the process gas 11 is degraded. In a case where the rotation speed exceeds the above-described range, there is a possibility of failure in forming a uniform concentration boundary layer on the surface of the silicon wafer W, leading to degradation of the film thickness uniformity and film quality uniformity of the coating layer 50a and the SiC film 50.

The surface treatment temperature, that is, the temperature of the silicon wafer W at the time of treatment of the surface of the silicon wafer W is preferably 600° C. or more and 1000° C. or less, and more preferably 700° C. or more and 900° C. or less. In a case where the temperature exceeds the above-described range, the surface of the silicon wafer W might not be sufficiently carbonized. In a case where the temperature exceeds the above-described range, carbonization of the surface of the silicon wafer W might exceed an appropriate degree, and the film thickness uniformity and film quality uniformity of the SiC film 50 formed on the surface of the silicon wafer W might be degraded. The surface treatment temperature preferably lower than the film formation temperature.

The film formation temperature, that is, the temperature of the silicon wafer W at the time of formation of the SiC film 50 on the surface of the silicon wafer W is preferably 800° C. or more and 1200° C. or less, more preferably 900° C. or more and 1100° C. or less. In a case where the temperature is below the above-described range, film thickness uniformity and film quality uniformity of the SiC film 50 might be degraded. Moreover, in a case where the temperature exceeds the above-described range, film thickness uniformity and film quality uniformity of the SiC film 50 might be deteriorated, or the silicon wafer W might be damaged.

In a case where carbonization treatment is performed as surface treatment of the silicon wafer W and where the SiC film 50 is formed on the surface of the silicon wafer W, the pressure within the reaction chamber 10 is preferably 1 kPa or more and 100 kPa or less, and more preferably 10 kPa or more and 50 kPa or less in the viewpoint of achieving high film thickness uniformity and high film quality uniformity of the SiC film 50.

As described above, with the vapor phase growth method according to the embodiment, it is possible to form a large area SiC thin film having few defects on a large area substrate and high film thickness uniformity and high film quality uniformity.

EXAMPLES

Hereinafter, examples of the present disclosure will be described.

Example 1

Using the vapor phase growth method according to the embodiment, the SiC film 50 was formed on a silicon wafer W having a surface of (001) plane and a diameter of 200 mm. First, the silicon wafer W was rotated at a rotation speed of 1500 rpm, the silicon wafer W was heated to 1100° C., and a gas containing hydrogen was supplied to perform pretreatment at a pressure of 26.6 kPa. Next, the silicon wafer W was rotated at a rotation speed of 1500 rpm, the silicon wafer W was heated to 1000° C., monomethylsilane was supplied, and the surface of the silicon wafer W was treated at a pressure of 26.6 kPa to form a coating layer 50a. Next, the silicon wafer W was rotated at a rotation speed of 1500 rpm, the silicon wafer W was heated to 1000° C., monomethylsilane and hydrogen chloride were supplied at a pressure of 26.6 kPa, and the SiC film 50 having a film thickness of 70 nm was formed on the surface of the silicon wafer W on which the coating layer 50a was formed.

Figure 5A:
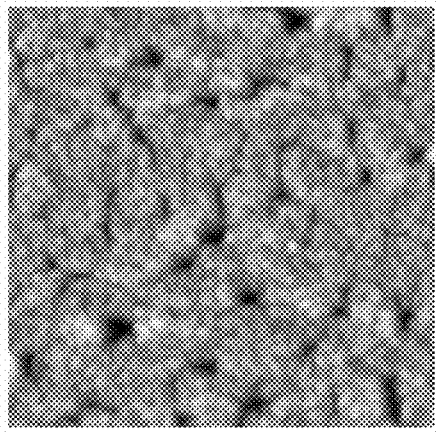
FIGS. 5A and 5B are diagrams illustrating evaluation results of an SiC film in Example 1.
Figure 5B:
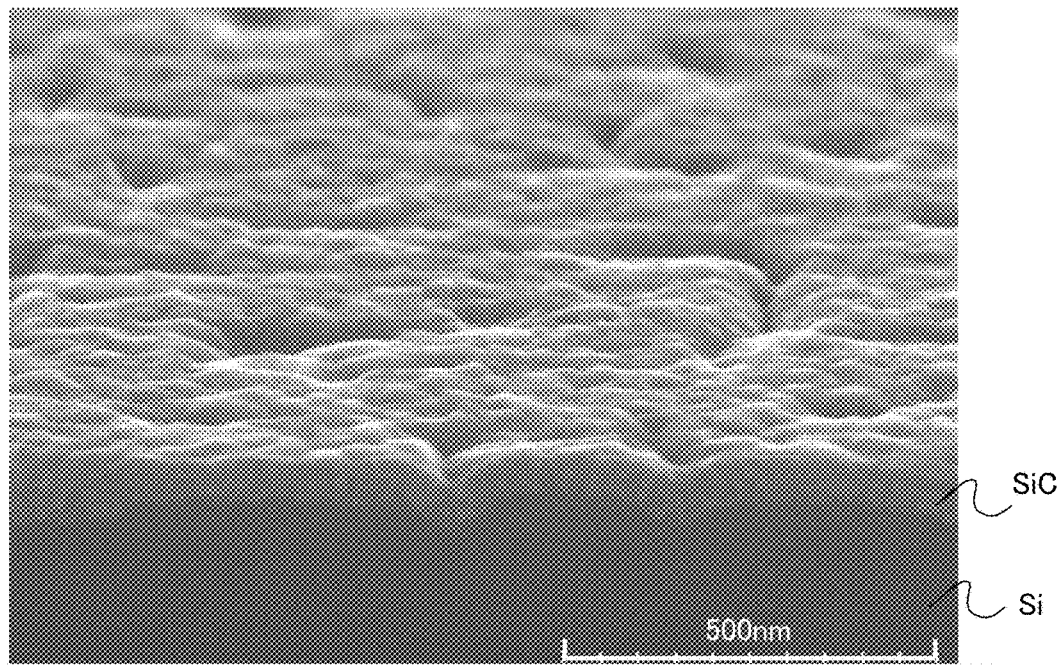

FIGS. 5A and 5B are diagrams illustrating evaluation results of the SiC film 50 in Example 1. FIG. 5A is an atomic force microscope (AFM) image of the surface of the formed SiC film 50. FIG. 5A illustrates a region of 3 μm×3 μm. The root mean square (RMS) of the surface roughness was 6.41 nm. FIG. 5B is an SEM photograph of the formed SiC film 50.

Example 2

The SiC film 50 was formed under the same conditions as in Example 1 except that the temperature of the silicon wafer W at the time of treatment of the surface of the silicon wafer W was set to 800° C.

Figure 6A:
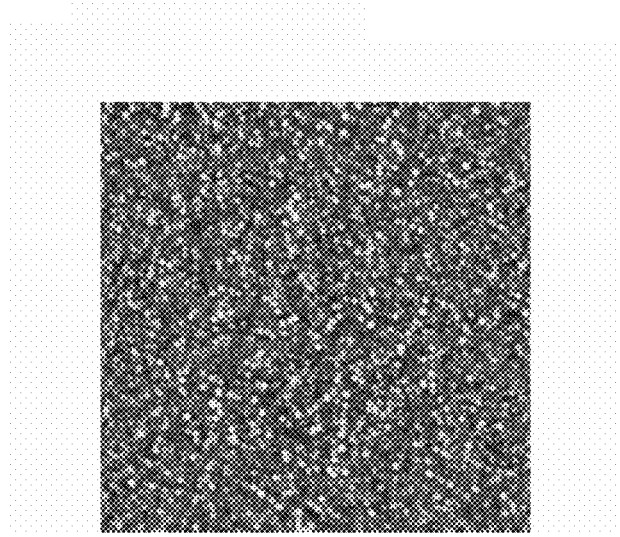
FIGS. 6A and 6B are diagrams illustrating evaluation results of an SiC film in Example 2.
Figure 6B:
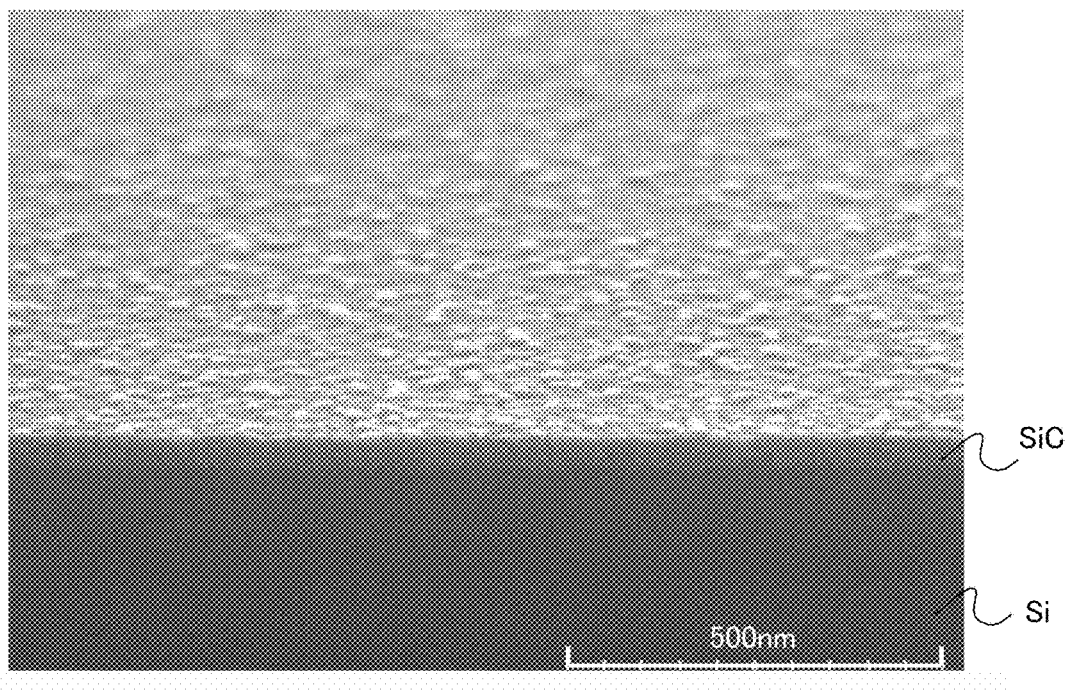

FIGS. 6A and 6B are diagrams illustrating evaluation results of the SiC film 50 in Example 2. FIG. 6A is an AFM image of the surface of the formed SiC film 50. FIG. 6A illustrates a region of 3 μm×3 μm. The RMS of the surface roughness was 2.44 nm. FIG. 6B is an SEM photograph of the formed SiC film 50.

The results of Examples 1 and 2 revealed that it is possible to form on a substrate the large area SiC film 50 having few defects and having high film thickness uniformity and high film quality uniformity by the vapor phase growth method according to the embodiment. In particular, as in Example 2, it was found that film thickness uniformity and surface flatness are enhanced by lowering the temperature of the silicon wafer W at the time of treatment of the surface of the silicon wafer W.

The embodiments and examples of the present disclosure have been described with reference to specific examples. The above-described embodiments and examples are merely given as examples, and do not limit the present disclosure.

The embodiment has described an exemplary case where the premixed process gas 11 is supplied to the reaction chamber 10. Alternatively, however, it may be configured such that the separated process gas is supplied to the reaction chamber 10 and mixed immediately before reaching the shower plate 22. Moreover, the process gas may be configured to be separated until it is ejected from the shower plate 22.

While the above description is an exemplary case where the annular holder 14 is used as a holder of the wafer W, the holder of the wafer W may be a dish-like susceptor having no opening at the center portion.

Moreover, while the embodiment describes a case where the heater includes two types of heaters, the inner heater 24 and the outer heater 26, there may be one type of heater or three or more types of heaters.

While descriptions of portions, or the like, not directly necessary for explanation of the present invention, such as apparatus configuration and manufacturing method, are omitted in the embodiments, it is possible to appropriately select and use necessary apparatus configuration and manufacturing method. All the vapor phase growth methods that include the elements of the present invention and that can be appropriately changed in design by those skilled in the art are included in the scope of the present invention. The scope of the present invention is defined by the scope of the claims and their equivalents.

What is claimed is:

1. A vapor phase growth method of forming on or above a single substrate a film having a composition different from a composition of the single substrate, the method comprising:
    rotating the single substrate with a center of the single substrate being a rotation center;
    heating the single substrate to a first temperature; and
    forming a silicon carbide film having a film thickness of 10 nm or more and 200 nm or less on or above a surface of the single substrate by supplying a first process gas containing silicon and carbon as a laminar flow in a direction substantially perpendicular to the surface of the single substrate.

2. The vapor phase growth method according to claim 1, further comprising:
    heating the single substrate to a second temperature before the heating the single substrate to the first temperature; and;
    performing surface treatment by supplying a second process gas containing at least carbon as a laminar flow in a direction substantially perpendicular to the surface of the single substrate.

3. The vapor phase growth method according to claim 1, wherein the silicon carbide film includes one of an amorphous film and a polycrystalline film.

4. The vapor phase growth method according to claim 1, wherein the single substrate includes a silicon layer.

5. The vapor phase growth method according to claim 1, wherein a coating layer is formed on the single substrate, the coating layer includes at least one material selected from the group consisting of silicon oxide, silicon nitride, silicon carbide and silicon, and the silicon carbide film is formed on the coating layer.

6. The vapor phase growth method according to claim 1, wherein the silicon carbide film contains 3C-SiC.

7. The vapor phase growth method according to claim 1, wherein the first temperature is 1000° C. or more and 1200° C. or less.

8. The vapor phase growth method according to claim 1, wherein a rotation speed of the single substrate in the rotating is 500 rpm or more and 2000 rpm or less.

9. The vapor phase growth method according to claim 1, wherein the first process gas is supplied from a shower plate provided substantially parallel to the surface of the single substrate and facing the surface of the single substrate, and the distance between the surface of the single substrate and the shower plate is 3 cm or more and 20 cm or less.

10. The vapor phase growth method according to claim 2, wherein the second temperature is lower than the first temperature, and the second temperature is 600° C. or more and 1000° C. or less.

11. The vapor phase growth method according to claim 2, wherein the single substrate is carbonized by the surface treatment.

12. A vapor phase growth method comprising:
    loading a substrate into a reaction chamber of a single wafer type vapor phase growth apparatus;
    holding the substrate on a holder provided in the reaction chamber;
    rotating the substrate with a center of the substrate being a rotation center;
    heating the substrate to a first temperature; and
    forming a silicon carbide film having a film thickness of 10 nm or more and 200 nm or less on or above a surface of the substrate by supplying a first process gas containing silicon and carbon from a shower plate, the shower plate provided substantially parallel to the surface of the substrate and facing the surface of the substrate, and the shower plate provided on an upper portion of the reaction chamber.

13. The vapor phase growth method according to claim 12, further comprising:
    heating the substrate to a second temperature before the heating the substrate to the first temperature; and;
    performing surface treatment by supplying a second process gas containing at least carbon from the shower plate.

14. The vapor phase growth method according to claim 12, wherein the silicon carbide film includes one of an amorphous film and a polycrystalline film.

15. The vapor phase growth method according to claim 12, wherein the substrate includes a silicon layer.

16. The vapor phase growth method according to claim 12, wherein a coating layer is formed on the substrate, the coating layer includes at least one material selected from the group consisting of silicon oxide, silicon nitride, silicon carbide and silicon, and the silicon carbide film is formed on the coating layer.

17. The vapor phase growth method according to claim 12, wherein the silicon carbide film contains 3C-SiC.

18. The vapor phase growth method according to claim 12, wherein the first temperature is 1000° C. or more and 1200° C. or less.

19. The vapor phase growth method according to claim 12, wherein a rotation speed of the substrate in the rotating is 500 rpm or more and 2000 rpm or less.

20. The vapor phase growth method according to claim 12, wherein the distance between the surface of the substrate and the shower plate is 3 cm or more and 20 cm or less.

21. The vapor phase growth method according to claim 13, wherein the second temperature is lower than the first temperature, and the second temperature is 600° C. or more and 1000° C. or less.

22. The vapor phase growth method according to claim 13, wherein the substrate is carbonized by the surface treatment.

* * * * *